US012724146B2

(12) United States Patent
Giusti et al.

(10) Patent No.: US 12,724,146 B2
(45) Date of Patent: Sep. 1, 2026

(54) PMUT ARRAY WITH RESONANCE FREQUENCY TUNABLE DUE TO ADJUSTABLE EMBEDDED CAVITY

(71) Applicant: STMicroelectronics International N.V., Geneva (CH)

(72) Inventors: Domenico Giusti, Caponago (IT); Marco Ferrera, Concoerezzo (IT); Fabio Quaglia, Pizzale (IT)

(73) Assignee: STMicroelectronics International N.V., Geneva (CH)

( * ) Notice: Subject to any disclaimer, the term of this patent is extended or adjusted under 35 U.S.C. 154(b) by 850 days.

(21) Appl. No.: 18/107,814

(22) Filed: Feb. 9, 2023

(65) Prior Publication Data

US 2024/0272298 A1 Aug. 15, 2024

(51) Int. Cl.

| | |
|---|---|
| ***G01S 15/89*** | (2006.01) |
| ***H10N 30/30*** | (2023.01) |
| *B06B 1/06* | (2006.01) |
| *H10N 30/20* | (2023.01) |

(52) U.S. Cl.

CPC ....... *G01S 15/8927* (2013.01); *H10N 30/308* (2023.02); *B06B 1/0622* (2013.01); *B81B 2203/0315* (2013.01); *B81B 2207/092* (2013.01); *H10N 30/2047* (2023.02)

(58) Field of Classification Search

CPC ... B06B 1/0607; B06B 1/0622; B06B 1/0666; H10N 30/50; H10N 30/308; H10N 30/2047; G01S 15/8915; G01S 15/8927; G01S 15/66; G01S 15/895;

(Continued)

(56) References Cited

U.S. PATENT DOCUMENTS

| | | | |
|---|---|---|---|
| 6,585,653 | B2 | 7/2003 | Miller |
| 2007/0057600 | A1 | 3/2007 | Fukuda et al. |
| 2013/0162102 | A1 | 6/2013 | Sammoura et al. |

(Continued)

FOREIGN PATENT DOCUMENTS

| | | | |
|---|---|---|---|
| CN | 106660074 | A | 5/2017 |
| CN | 115025959 | A | 9/2022 |

(Continued)

OTHER PUBLICATIONS

Onscale, "Accelerating Ultrasonic Fingerprint Sensor R&D with Cloud Simulation," Apr. 2019, 8 pgs.

(Continued)

*Primary Examiner* — J. San Martin
(74) *Attorney, Agent, or Firm* — Crowe & Dunlevy LLC

(57) ABSTRACT

An array of piezoelectric micromachined ultrasound transducers (PMUTs) includes a substrate having first and second cavities buried therein. A first piezoelectric stack is carried by the substrate and at least partially overlays the first cavity. A second piezoelectric stack is carried by the substrate and at least partially overlays the second cavity. A thickness of the substrate between the second cavity and the second piezoelectric stack forms a membrane. Circuitry operates the second piezoelectric stack so as to vibrate the membrane to generate a pulse of ultrasound and to immediately subsequently operate the first piezoelectric stack to cause deformation of the second cavity which results in an increase in a resonant frequency of the membrane.

18 Claims, 18 Drawing Sheets

(58) Field of Classification Search
CPC ............. G01S 7/52079; G01S 7/52036; B81B 2207/092; B81B 2203/0315
See application file for complete search history.

(56) References Cited

U.S. PATENT DOCUMENTS

| | | | | |
|---|---|---|---|---|
| 2013/0270967 | A1* | 10/2013 | Dausch | H10N 30/2047 310/365 |
| 2015/0145374 | A1 | 5/2015 | Xu et al. | |
| 2015/0169136 | A1 | 6/2015 | Ganti et al. | |
| 2017/0261610 | A1 | 9/2017 | Scally et al. | |
| 2017/0322290 | A1 | 11/2017 | Ng et al. | |
| 2018/0178251 | A1* | 6/2018 | Foncellino | B06B 1/0622 |
| 2019/0267536 | A1* | 8/2019 | Apte | B06B 1/0662 |
| 2022/0118480 | A1* | 4/2022 | Giusti | B81B 7/0016 |
| 2024/0024916 | A1* | 1/2024 | Kraft | B06B 1/0622 |
| 2024/0269708 | A1* | 8/2024 | Giusti | H10N 30/2047 |

FOREIGN PATENT DOCUMENTS

| | | | | |
|---|---|---|---|---|
| WO | WO-2025100016 | A1 * | 5/2025 | H10N 30/88 |
| WO | WO-2025124939 | A1 * | 6/2025 | B06B 1/0666 |

OTHER PUBLICATIONS

The Pennsylvania State University, University Park, “Design and Ultrasonic Characterization of a Thin-Film, Flexible, PMUT Array,” Nov. 2020, 6 pgs.

Sun, Sheng, et al.: “Eye-Tracking Monitoring Based on PMUT Arrays,” Journal of Microelectromechanical Systems, vol. 31, No. 1, Feb. 2022, pp. 45-53.

Sun, Sheng, et al.: “MEMS Ultrasonic Transducers for Safe, Low-Power and Portable Eye-Blinking Monitoring,” Microsystems & Nanoengineering, https://doi.org/10.1038/s41378-022-00396-w, 2022, 14 pgs.

CN First Office Action and Search Report for counterpart CN Appl. No. 202410158206.0, report dated Apr. 23, 2026, 5 pgs.

* cited by examiner

PMUT ARRAY WITH RESONANCE FREQUENCY TUNABLE DUE TO ADJUSTABLE EMBEDDED CAVITY

TECHNICAL FIELD

This disclosure is related to the field of piezoelectric micromachined ultrasound transducers (PMUTs) and, in particular, to a design for an array of PMUTs having tunable resonance frequencies due to being positioned over at least one selectively deformable cavity.

BACKGROUND

Virtual and augmented reality devices include wearable headsets or glasses that function to display images to users in a fashion that either replaces the user's currently visually perceived reality with a projected "virtual" reality or that overlays images over the user's currently visually perceived reality to "augment" that reality. In certain virtual and augmented reality devices, it is desired for the virtual or augmented reality device to be able to track the eye movements of the user so as to be able provide the user with a virtual or augmented reality that changes with the user's eye position.

Certain known techniques for tracking eye movements are more effective at tracking soft pursuit by the eye (e.g., following an object with the eye or reading) than tracking fast pursuit by the eye (e.g., saccades; a rapid eye movement that shifts the center of the eye's gaze from one part of the visual field to another, such as for orienting the eye's gaze toward an object of interest). However, tracking both soft pursuit and fast pursuit is desired.

Eye tracking involves tracking the distance between a sensing device and parts of the eye (e.g., sclera, cornea). As the eye rotates within the eye socket, the distance between the sensing device and those parts of the eye changes. The position of the eye can be determined from the changes in these distances. The challenge in tracking fast pursuit eye movement is that such tracking requires a high sampling rate.

One technology that may be used to track eye movements is ultrasonic sensing in which ultrasonic waves are emitted toward the eye and reflections of the ultrasonic waves off the eye are detected. By measuring the time of flight of those ultrasound waves, distance to parts of the eye can be determined.

One type of ultrasound sensing technology involves micromachined ultrasound transducers (MUTs), and in particular those referred to as piezoelectric micromachined ultrasound transducers (PMUTSs).

A PMUT element is formed by a membrane suspended over a cavity carrying a layer of piezoelectric material sandwiched between thin electrode layers. The sandwiching of the piezoelectric material between the thin electrode layers can be thought of as a parallel plate capacitor with a piezoelectric layer between the plates. In operation, a voltage is applied across the electrodes, resulting in a lateral strain being induced in the membrane via the piezoelectric effect causing movement of the piezoelectric layer. By applying a suitable AC voltage between the electrodes oscillation of the membrane is induced and an ultrasound wave is generated.

For use in the application to measure eye movements, it is desired for an ultrasound imaging device to be capable of producing certain bandwidths of ultrasound waves.

An eye tracking sensor based on PMUT technology involves an array of PMUT elements. Challenges in creating such devices arise in that in a high uniformity in the frequency of the ultrasound waves emitted by different elements of the PMUT array is desired for high accuracy, and wide frequency bandwidth ultrasound waves are desired for high axial resolution. Current devices do not address these challenges sufficiently for certain applications—for example, certain designs insufficiently damp ringing of the membrane caused by the high Q-factor of the membrane, leading to poor axial resolution and a narrow frequency bandwidth. Given this, further development is needed.

SUMMARY

An array of piezoelectric micromachined ultrasound transducers (PMUTs) is disclosed herein and includes a substrate having at least one first cavity and at least one second cavity buried therein, with at least one first piezoelectric stack carried by the substrate and at least partially overlaying the at least one first cavity and at least one second piezoelectric stack carried by the substrate and at least partially overlaying the at least one second cavity. A thickness of the substrate between the at least one second cavity and the at least one second piezoelectric stack forms a membrane. Circuitry is configured to operate the at least one second piezoelectric stack so as to vibrate the membrane to generate a pulse of ultrasound and to immediately subsequently operate the at least one first piezoelectric stack to cause deformation of the at least one second cavity which results in an increase in a resonant frequency of the membrane.

The at least one second cavity may be sized and shaped so that membrane is larger in area than the at least one second piezoelectric stack such that the at least one second piezoelectric stack is carried in its entirety by the membrane.

The at least one first cavity may be a pair of adjacent cavities buried within the substrate. The at least one first piezoelectric stack may be a pair of first piezoelectric stacks each carried by the substrate and at least partially overlying an associated one of the pair of adjacent cavities. The pair of first piezoelectric stacks may be differentially driven by the circuitry during operation when causing deformation of the at least one second cavity to result in the increase in the resonant frequency of the membrane.

The at least one second cavity comprises a plurality of adjacent second cavities; wherein the at least one second piezoelectric stack comprises a plurality of second piezoelectric stacks each carried by the substrate and at least partially overlying an associated one of the pair of adjacent cavities; wherein a thickness of the substrate between each of the plurality of adjacent second cavities and an associated one of the plurality of second piezoelectric stacks forms a different membrane.

Each of the plurality of second piezoelectric stacks may be operated simultaneously by the circuitry to vibrate an associated membrane one of the different membranes to generate a pulse of ultrasound and immediately subsequently each of the plurality of first piezoelectric stacks is operated simultaneously by the circuitry to cause an increase in a resonant frequency of the different membranes.

The increases in the resonant frequency of the different membranes may be equal.

The substrate may have at least one third cavity buried therein directly underlying the at least one first cavity, and the substrate may have at least one fourth cavity buried therein directly underlying the at least one second cavity.

The at least one first cavity may be plurality of first cavities buried within the substrate and arranged into a first desired shape about perimeter of a given location. The at least one first piezoelectric stack may be a plurality of first piezoelectric stacks each carried by the substrate and at least partially overlying an associated one of the plurality of first cavities. The at least one second cavity may be a plurality of second cavities buried within the substrate and arranged into a second desired shape inside the perimeter of the given location. The at least one second piezoelectric stack may be a plurality of second piezoelectric stacks each carried by the substrate and at least partially overlying an associated one of the plurality of second cavities. A thickness of the substrate between each of the plurality of adjacent second cavities and an associated one of the plurality of second piezoelectric stacks may form a different membrane.

The first desired shape may be a first rectangular shape, and the second desired shape may be a second rectangular shape.

The first and second desired shapes may be rotated with respect to one another about a central point.

The plurality of second cavities may be greater in number than the plurality of first cavities, and the plurality of second piezoelectric stacks may be greater in number than the plurality of first piezoelectric stacks.

The piezoelectric stacks of the first plurality of piezoelectric stacks may be larger in area than the piezoelectric stacks of the second plurality of piezoelectric stacks.

The deformation of the at least one second cavity which results in an increase in the resonant frequency of the membrane may be a reduction in a depth of the at least one second cavity.

A method aspect is also disclosed herein. In detail, disclosed herein is a method of generating ultrasound. This method includes: a) operating at least one second piezoelectric stack so as to vibrate an underlying membrane forming a roof of a subsurface cavity to thereby generate at least one pulse of ultrasound; b) immediately subsequently to performing a), operating the at least one first piezoelectric stack so as to deform a substrate into which the subsurface cavity is buried to cause deformation of the subsurface cavity, thereby increasing a resonant frequency of the membrane; and returning to a).

The operating of the at least one second piezoelectric stack may include operating a plurality of second piezoelectric stacks to vibrate respective different underlying membranes forming roofs of respective subsurface cavities associated with the plurality of second piezoelectric stacks to thereby generate at least one pulse of ultrasound.

The operating of the at least one first piezoelectric stack may include operating a plurality of first piezoelectric stacks to cause an increase in the resonant frequency of the different membranes.

The increases in the resonant frequency of the different membranes may be equal.

The deformation of the subsurface cavity which results in an increase in the resonant frequency of the membrane may be a reduction in a depth of the subsurface cavity.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figures 1, 2:
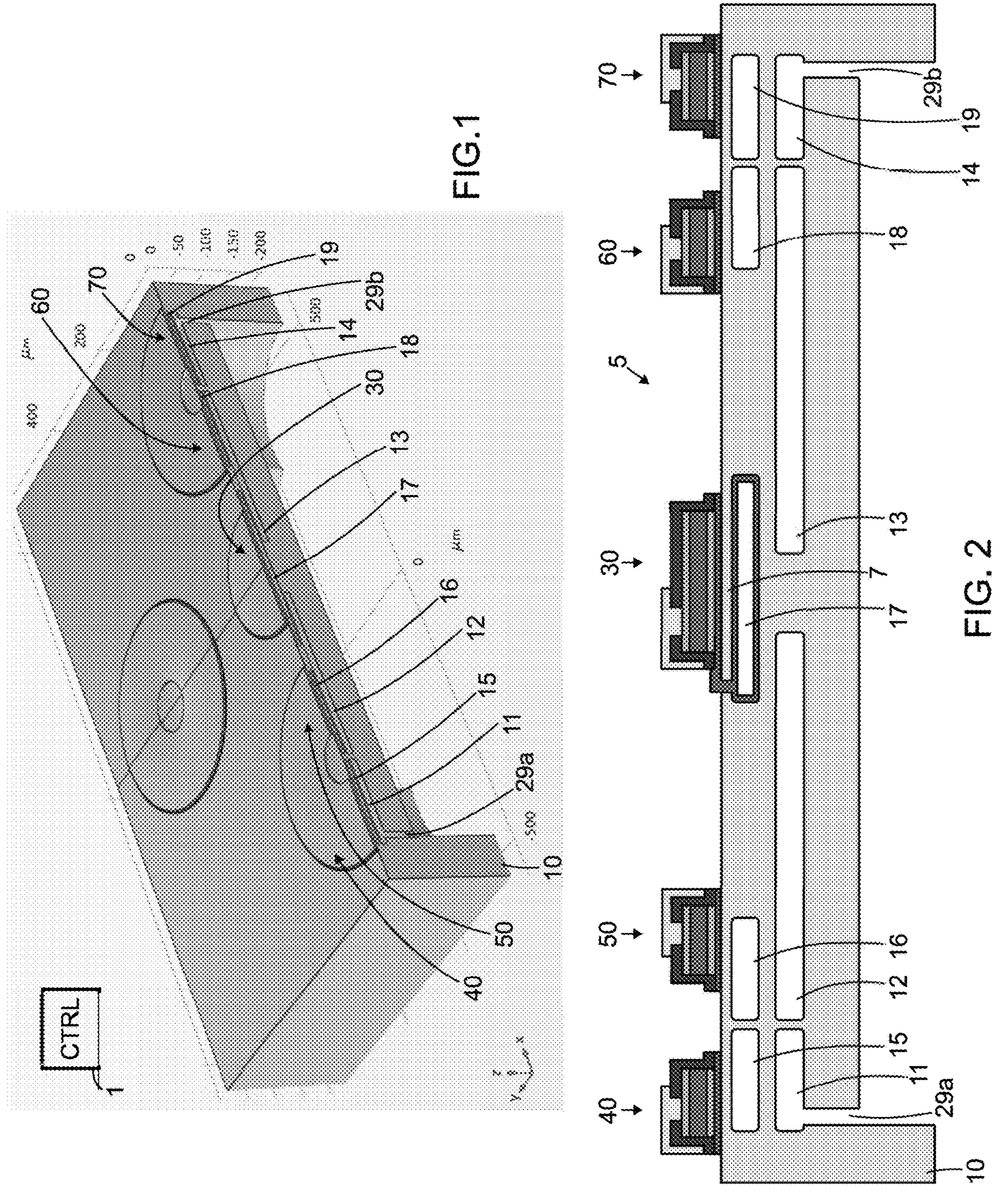
FIG. 1 is a perspective cutaway view of an array of PMUT devices as disclosed herein.
FIG. 2 is a cross sectional view of the array of FIG. 1.

Now described with initial reference to FIGS. 1-2 is an array 5 of piezoelectric micromachined ultrasound transducers (PMUTs). The array 5 includes a substrate 10 with piezoelectric stacks 30, 40, 50, 60, 70 formed on its back face. The substrate 10 has subsurface cavities 11-19 defined therein. In particular, cavities 15 and 16 directly underlie piezoelectric stacks 40 and 50, cavity 17 directly underlies piezoelectric stack 30, and cavities 18 and 19 directly underlie piezoelectric stacks 60 and 70. Cavity 15 directly overlies cavity 11 and cavity 16 directly overlies cavity 12, while cavity 18 directly overlies cavity 13 and cavity 19 directly overlies cavity 14. Cavity 17 partially (and directly) overlies both cavities 12 and 13.

Cavities 12, 13, 15, 16, 18, and 19 are completely sealed by the surrounding substrate 10 and lack openings therein. Cavity 11 is not sealed and is fluidly connected to the front face of the substrate 10 by trench 29*a*, and similarly cavity 14 is not sealed and is fluidly connected to the front face of the substrate 10 by trench 29*b*. Cavity 17 would be in fluid communication with the back face of the substrate 10 but for tetraethylorthosilicate (TEOS) layer 25 (described below) which plugs the trench that would otherwise connect cavity 17 to the back face of the substrate 10.

Figure 3:
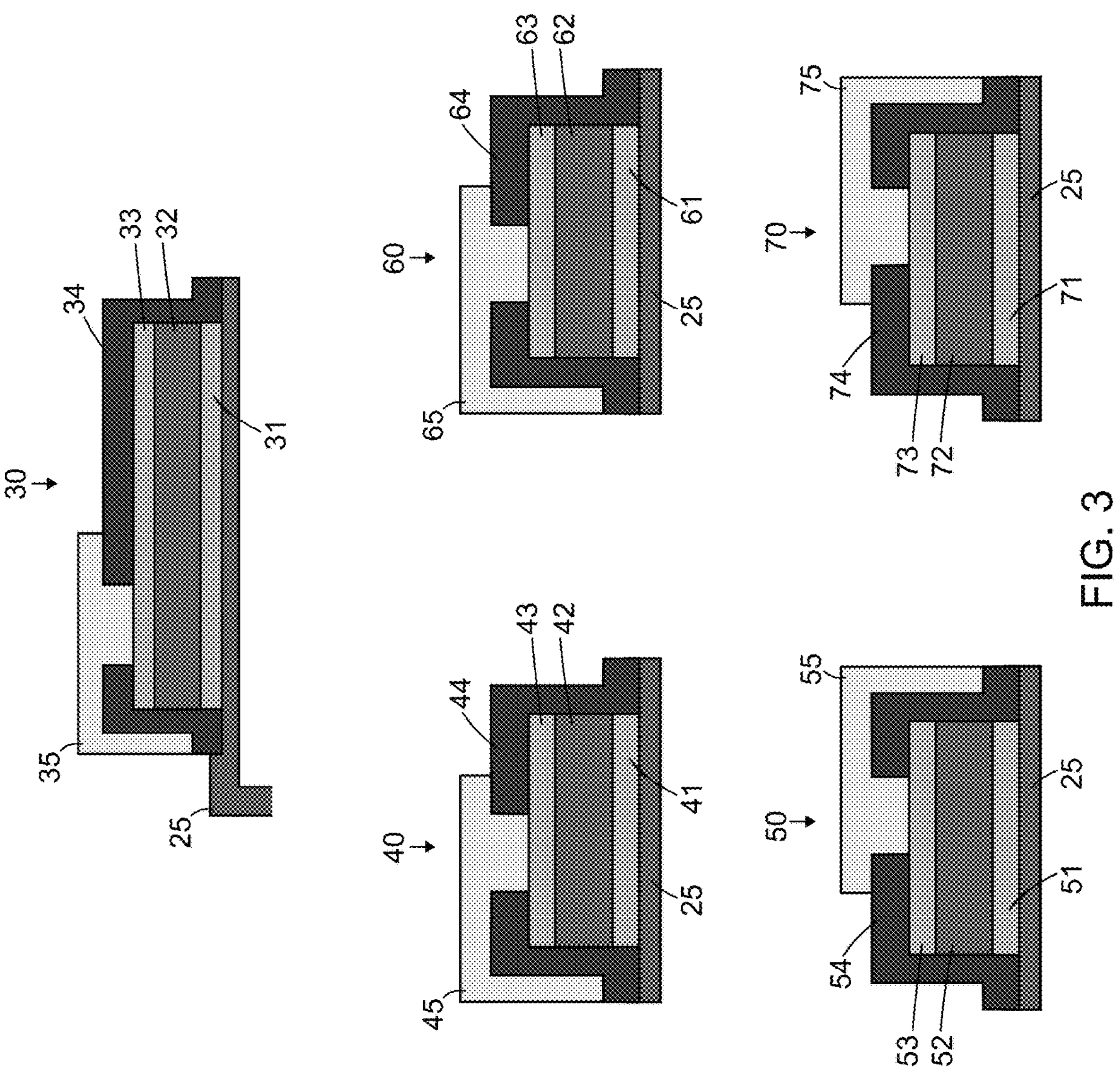
FIG. 3 contains cross-sectional views of the piezoelectric stacks of the array of FIGS. 1-2.

The piezoelectric stacks 30, 40, 50, 60, and 70 are best understood with additional reference to FIG. 3.

The piezoelectric stack 30 includes a piezoelectric layer 32 sandwiched between a top electrode 33 and a bottom electrode 31. A dielectric layer 34 covers the sidewalls of the piezoelectric stack and a portion of the top face of the top electrode 33. A conductor 35 extends through the dielectric layer 34 to make physical and electrical contact with the top face of the top electrode 33. The bottom electrode 31 is carried by the TEOS layer 25. The portion of the substrate 10 directly underlying the piezoelectric stack 30 can be thought of as the membrane 7 used in generation of ultrasound waves by the application of a time varying voltage across the top electrode 33 and bottom electrode 31. The volume and shape of the cavity 17 underlying this membrane 7 has an effect on the resonance frequency of the membrane 7.

The piezoelectric stack 40 includes a piezoelectric layer 42 sandwiched between a top electrode 43 and a bottom electrode 41. A dielectric layer 44 covers the sidewalls of the piezoelectric stack and a portion of the top face of the top electrode 43. A conductor 45 extends through the dielectric layer 44 to make physical and electrical contact with the top face of the top electrode 43. The bottom electrode 41 is carried by the TEOS layer 25.

The piezoelectric stack 50 includes a piezoelectric layer 52 sandwiched between a top electrode 53 and a bottom electrode 51. A dielectric layer 54 covers the sidewalls of the piezoelectric stack and a portion of the top face of the top electrode 53. A conductor 55 extends through the dielectric layer 54 to make physical and electrical contact with the top face of the top electrode 53. The bottom electrode 51 is carried by the TEOS layer 25.

Piezoelectric stacks 40 and 50 are paired and configured to be differentially driven such that, under application of a DC bias, their piezoelectric layers 42 and 52 deform in opposite directions.

The piezoelectric stack 60 includes a piezoelectric layer 62 sandwiched between a top electrode 63 and a bottom electrode 61. A dielectric layer 64 covers the sidewalls of the piezoelectric stack and a portion of the top face of the top electrode 63. A conductor 65 extends through the dielectric layer 64 to make physical and electrical contact with the top face of the top electrode 63. The bottom electrode 61 is carried by the TEOS layer 25.

The piezoelectric stack 70 includes a piezoelectric layer 72 sandwiched between a top electrode 73 and a bottom electrode 71. A dielectric layer 74 covers the sidewalls of the piezoelectric stack and a portion of the top face of the top electrode 73. A conductor 75 extends through the dielectric layer 74 to make physical and electrical contact with the top face of the top electrode 73. The bottom electrode 71 is carried by the TEOS layer 25.

Piezoelectric stacks 60 and 70 are paired and configured to be differentially driven such that, under application of a DC bias, their piezoelectric layers 62 and 72 deform in opposite directions.

In operation, DC biases are applied to the piezoelectric stack pairs 40, 50 and 60, 70, resulting in deformation of their respective piezoelectric layers 42, 52 and 62, 72. The cavities 15, 16, 11, 12 and 18, 19, 13, 14 serve to reduce the rigidity of the substrate 10 as formed, and therefore when the piezoelectric layers 42, 52 and 62, 72 deform, the cavities 15, 16, 11, 12 and 18, 19, 13, 14 themselves deform. This in turn causes deformation of the cavity 17, and since the volume and shape of the cavity 17 underlying the membrane 7 has an effect on the resonance frequency of the membrane 7, the deformation of the cavities 15, 16, 11, 12 and 18, 19, 13, 14 serves to change the resonance frequency of the membrane 7.

Figure 4A:
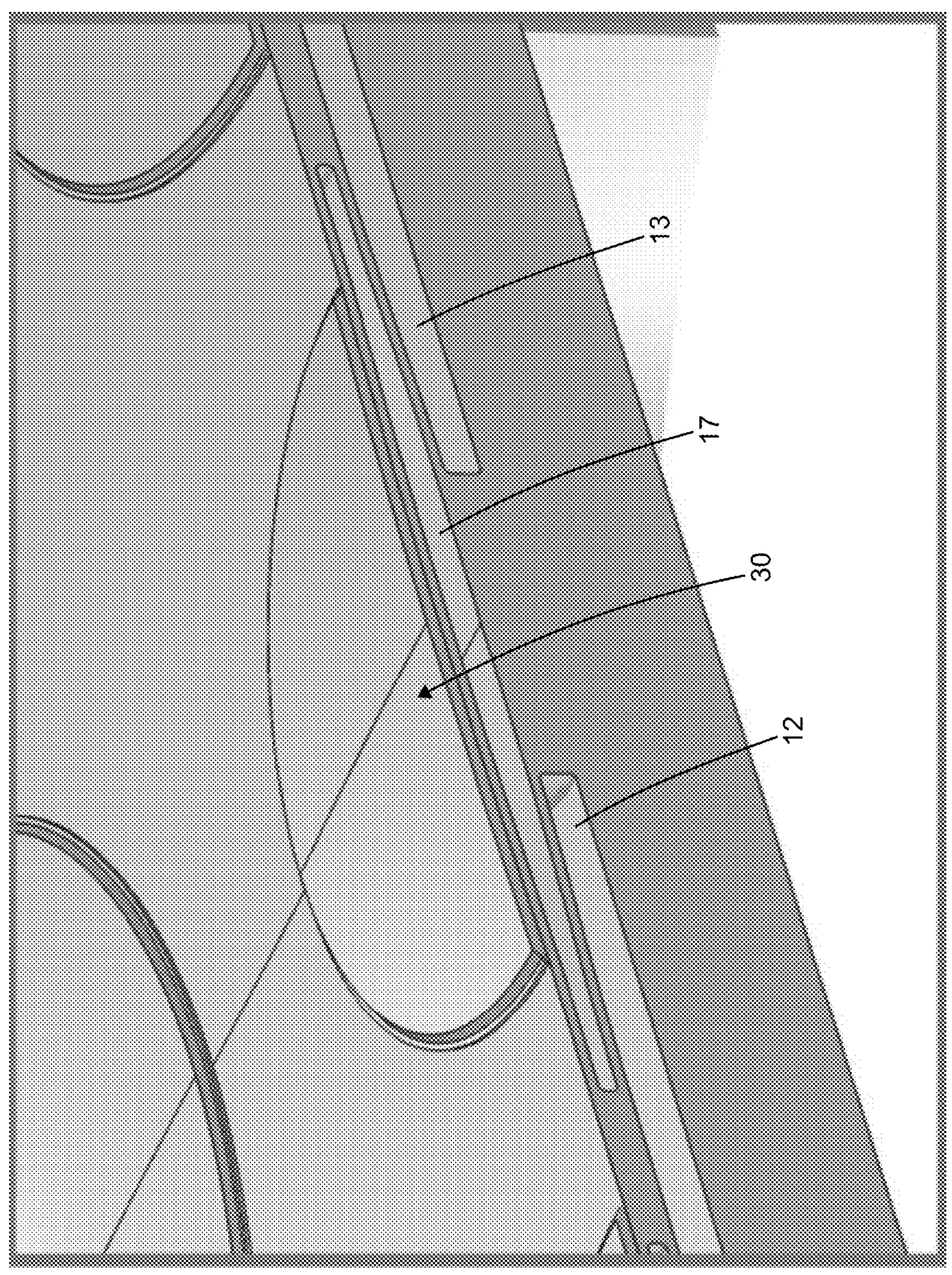
FIGS. 4A-4C are a series of perspective cutaway views of the array of FIGS. 1-2 during operation showing the deformation of the cavity under the ultrasound emitting PMUT.
Figure 4B:
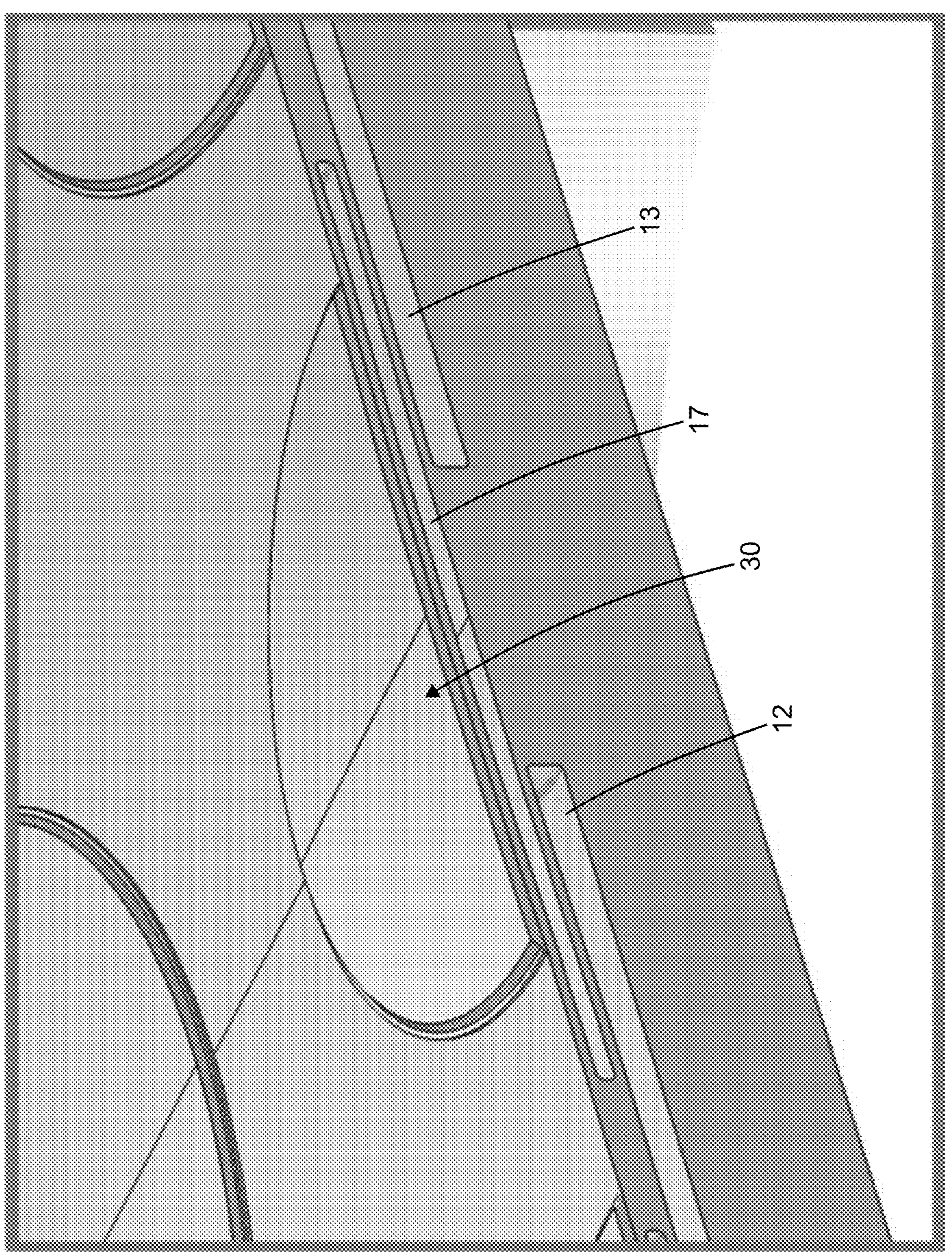
Figure 4C:
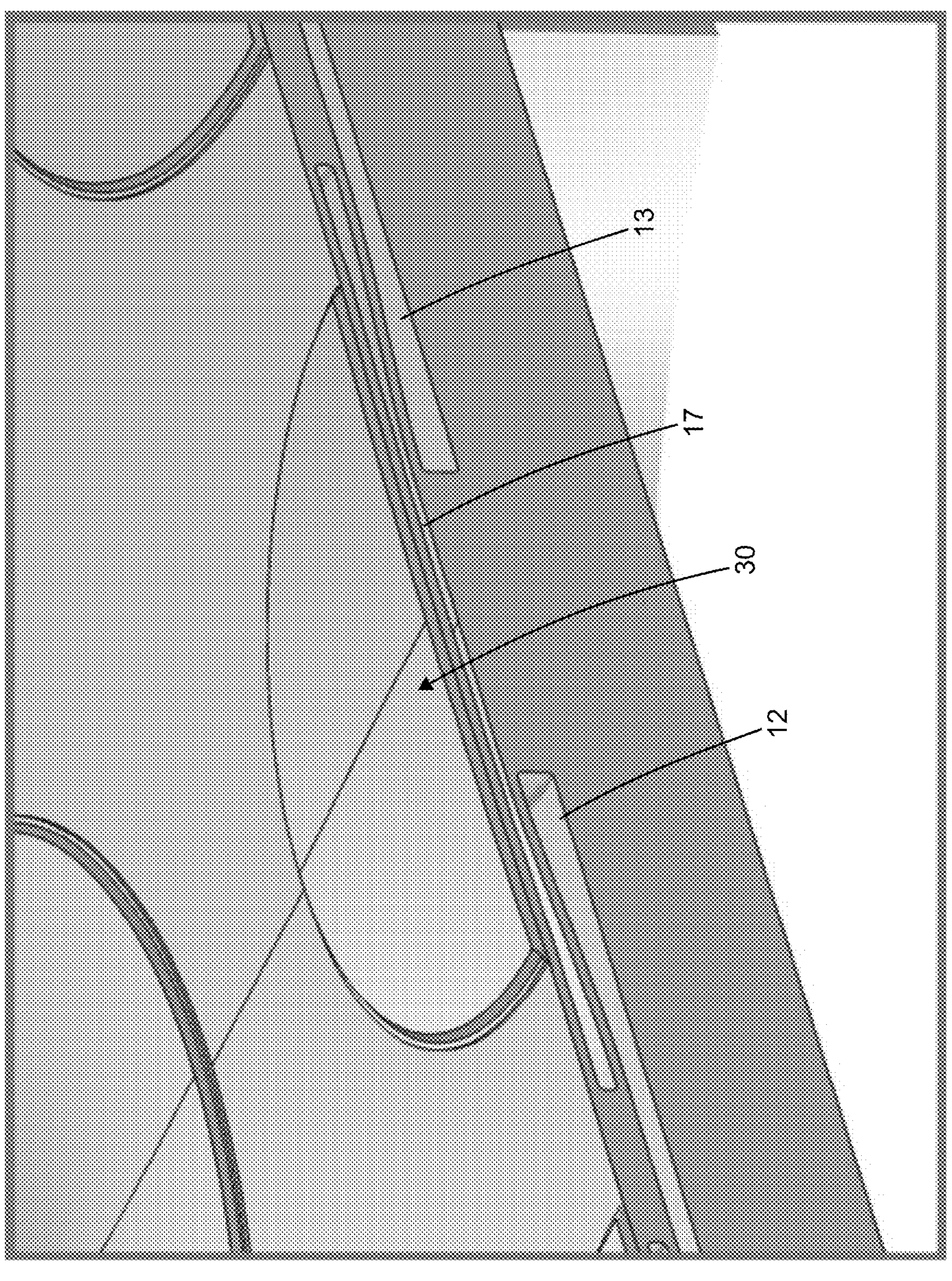

This effect can best be observed in the series of diagrams of FIGS. 4A-4C in which the deformation of the cavity 17 goes from a small amount in FIG. 4A to a large amount in FIG. 4C—the volume of the cavity 17 decreases from FIGS. 4A to 4C, raising the resonance frequency of the membrane 7.

Figure 5:
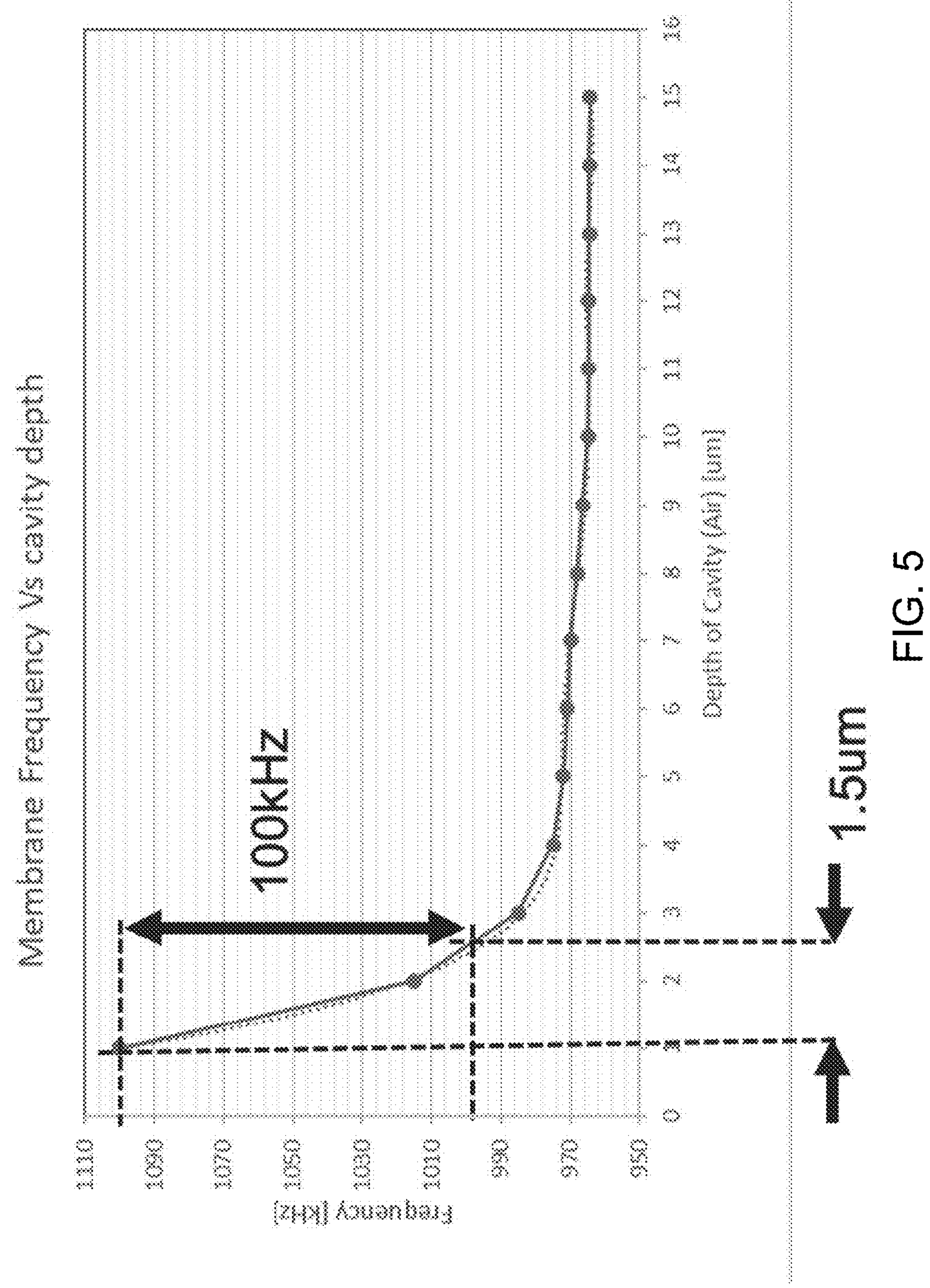
FIG. 5 is a graph showing the relationship between resonance frequency of the membrane under ultrasound emitting PMUT and the depth of the underlying cavity.

Refer now to the graph of FIG. 5 showing the relationship between the resonance frequency of the membrane 7 and the depth of the cavity 17. Notice that as the depth of the cavity 17 decreases (e.g., as the volume of the cavity decreases), the resonance frequency of the membrane 7 increases. With as little of a reduction in the depth of the cavity 17 by 1.5 μm, the resonance frequency of the membrane 7 increases by 100 kHz. The higher the resonance frequency of the membrane 7, the higher the Q-factor of the membrane 7 (e.g., the less time it takes ringing to stop after an oscillation of the membrane 7).

To take advantage of this, the piezoelectric stacks 40, 50 and 60, 70 are controlled by control circuitry 1 so that the cavity 17 is at a first set given depth (e.g., 2.5 μm) when the piezoelectric stack 30 is driven to generate one or a series of pulses of ultrasound but is then constricted to a second set given depth less than the first given depth (e.g., 1.5 μm) after the completion of the generation of the pulse or series of pulses of ultrasound. This operation is repeated for each pulse or series of pulses generated and serves to allow the pulse to be generated with the membrane 7 at a first resonance frequency (e.g., 995 kHz) suited to generating ultrasound at a desired frequency bandwidth but then for ringing of the membrane 7 to be damped by changing the resonance frequency of the membrane 7 to a second resonance frequency greater than the first resonance frequency (e.g., 1095 kHz) which reduces the ringing of the membrane 7 more quickly.

Figure 8A:
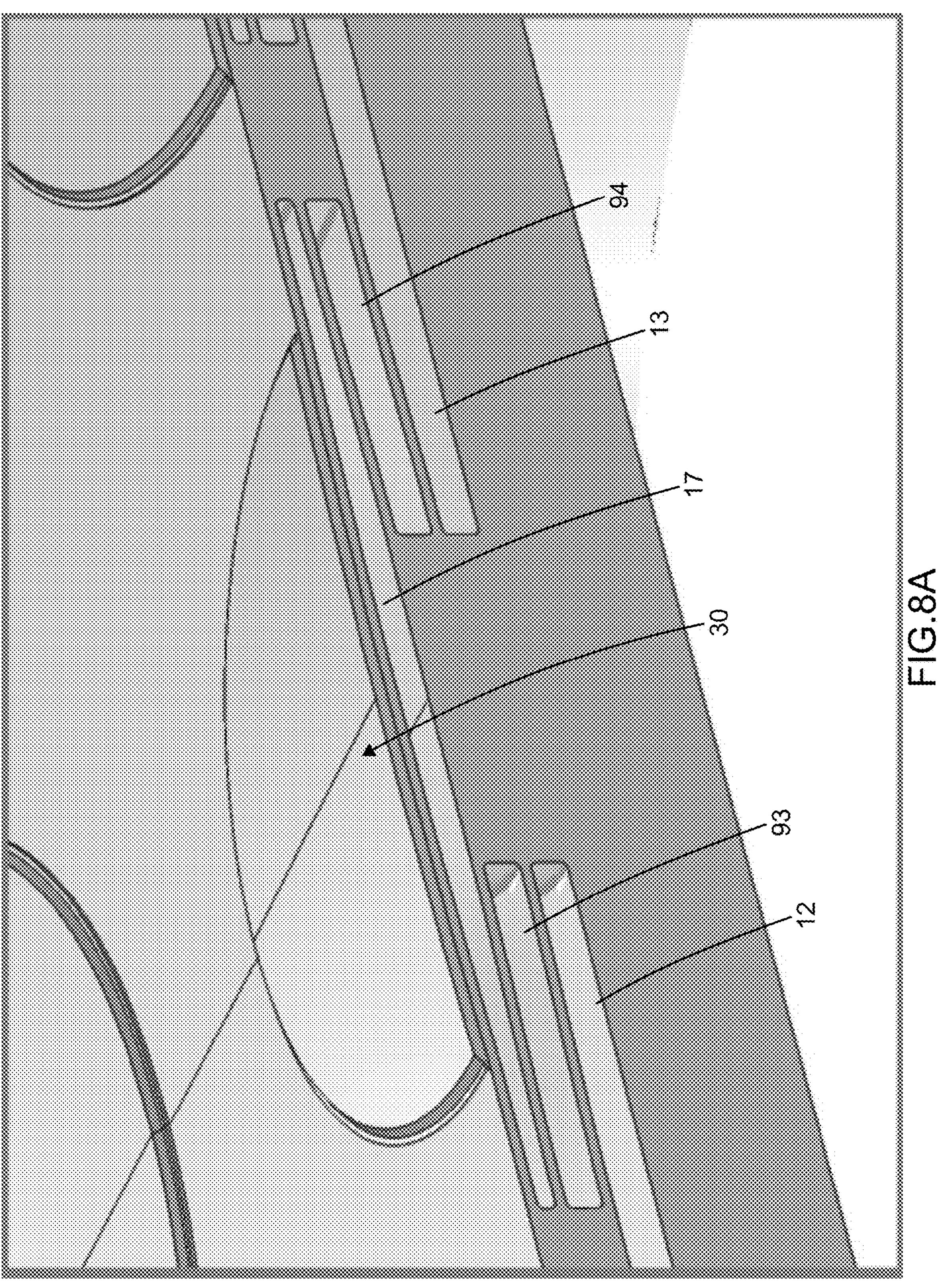
FIGS. 8A-8C are a series of perspective cutaway views of the array of FIGS. 6-7 during operation showing the deformation of the cavity under the ultrasound emitting PMUT.
Figure 8B:
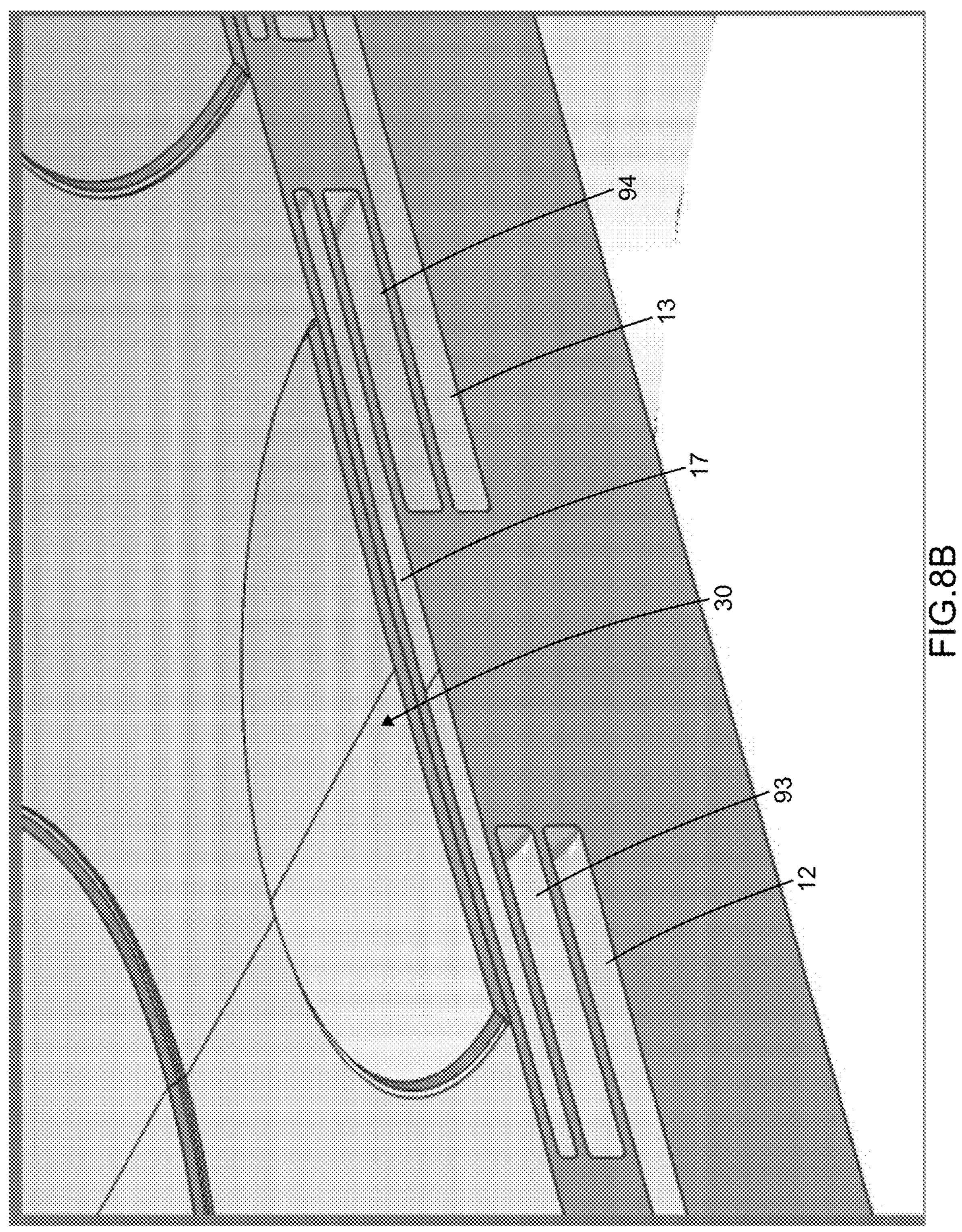
Figure 8C:
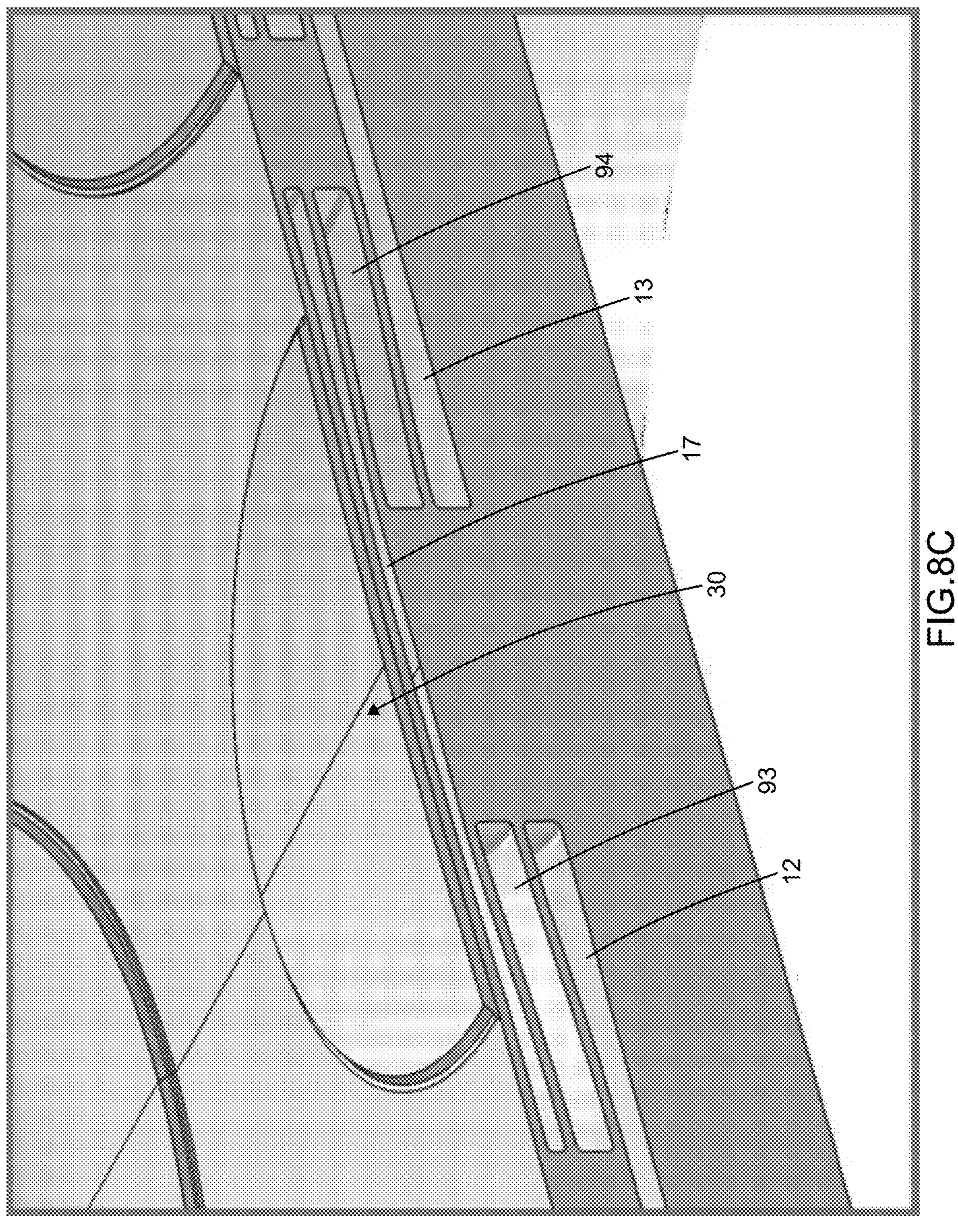

As explained above, the purpose of the cavities 15, 16, 11, 12 and 18, 19, 13, 14 is to reduce the rigidity of the substrate 10, enabling the deformation of the cavity 17 by the action of the piezoelectric stacks 40, 50 and 60, 70. Given this, it should be understood there may be additional such cavities to permit for additional reduction in the rigidity of the substrate 10 allowing for a further degree of deformation of the cavity 17, such as shown in the array 5' of FIGS. 6-7. Notice here the presence of cavity 91 positioned between cavities 11 and 15 such that cavity 91 directly overlies cavity 11 and directly underlies cavity 15, and the presence of cavity 92 positioned between cavities 12 and 16 such that cavity 92 directly overlies cavity 12 and directly underlies cavity 16. Similarly, cavity 95 is positioned between cavities 13 and 18 such that cavity 95 directly overlies cavity 13 and directly underlies cavity 18, and cavity 96 is positioned between cavities 14 and 19 such that cavity 96 directly overlies cavity 14 and directly underlies cavity 19. As can also be observed, cavity 93 is positioned between cavities 12 and 17 such that cavity 93 directly overlies cavity 12 and directly underlies cavity 17, and cavity 94 is positioned between cavities 13 and 17 such that cavity 94 directly overlies cavity 13 and directly underlies cavity 17. The deformation of the cavity 17 in this embodiment can be observed in the series of diagrams of FIGS. 8A-8C in which the deformation of the cavity 17 goes from a small amount in FIG. 8A to a large amount in FIG. 8C—the volume of the cavity 17 decreases from FIGS. 8A to 8C, raising the resonance frequency of the membrane 7.

Figures 9, 10:
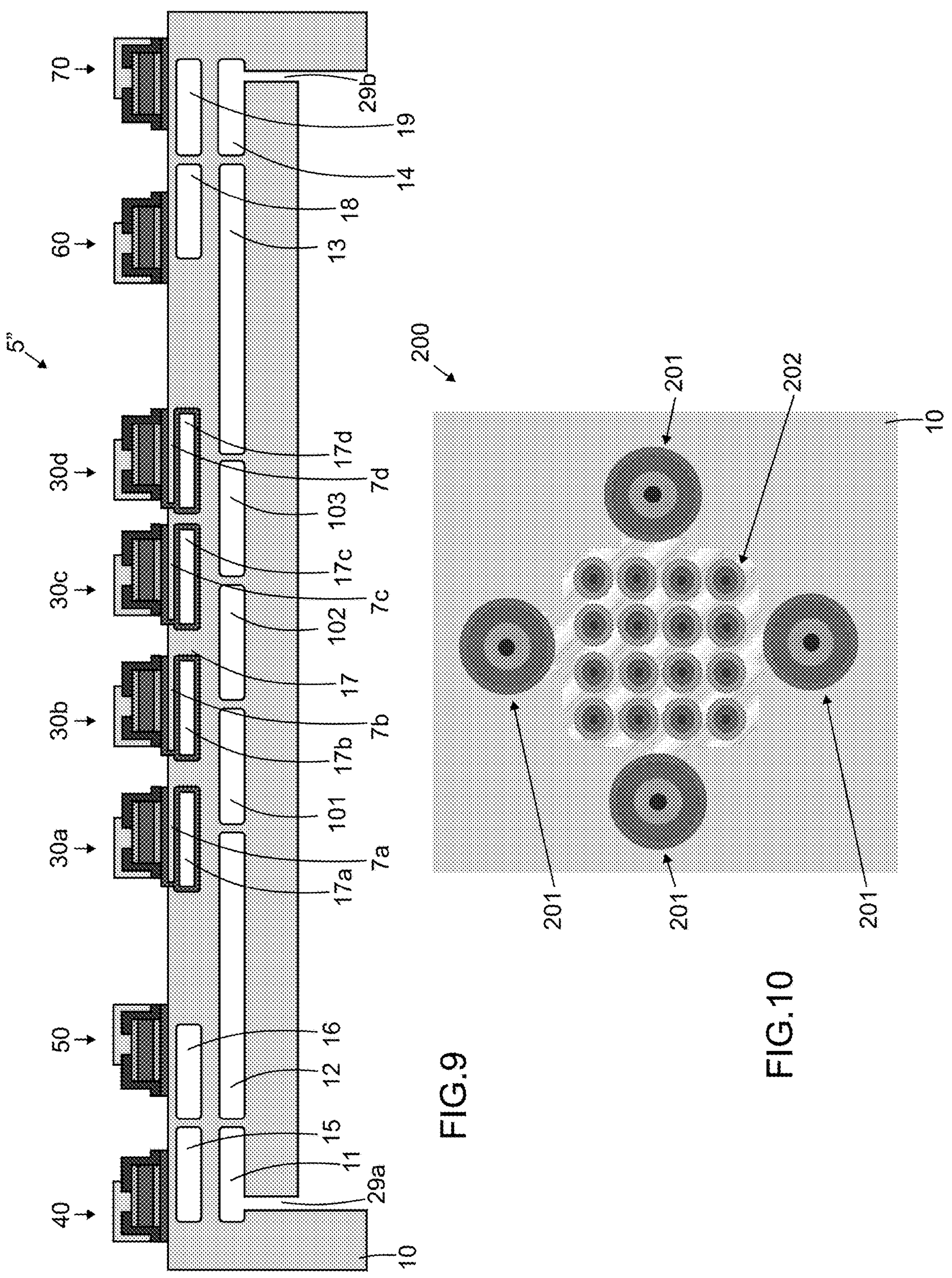
FIG. 9 is a cross-sectional view of an array of PMUT devices disclosed herein in which there are three levels of buried cavities within the substrate.
FIG. 10 is a top view of another embodiment of the array of PMUT devices disclosed herein.

In the above examples, there has been one piezoelectric stack 30 over one membrane 7 that spans the cavity 17 for generation of ultrasound, with the piezoelectric stacks 40, 50, 60, 70 being utilized for deformation of the cavity 17. With reference to FIG. 9, an embodiment of the array 5" is now described in which there are four piezoelectric stacks 30*a*, 30*b*, 30*c*, 30*d* each over a respective membrane 7*a*, 7*b*, 7*c*, 7*d* that spans across a corresponding cavity 17*a*, 17*b*, 17*c*, 17*d* for generation of ultrasound, with the piezoelectric stacks 40, 50, 60, 70 being utilized for deformation of the cavities 17*a*, 17*b*, 17*c*, 17*d*. Also here, cavities 101, 102, and 103 are buried within the substrate 10 between the cavities 12 and 13. The use of multiple piezoelectric stacks 30*a*, 30*b*, 30*c*, 30*d* over multiple membranes 7*a*, 7*b*, 7*c*, 7*d* permits the modulating of the resonance frequency of an array of membranes (the membranes 7*a*, 7*b*, 7*c*, and 7*d* forming the array in this example), providing the ability to steer and focus the acoustic beam formed by the generated ultrasound pulses.

A top view of the array 200 (described above with reference to FIG. 9) is now described with reference to FIG. 10. In this embodiment, a plurality of piezoelectric stacks 202 in a desired configuration are each positioned on a respective membrane (not shown) that spans across a corresponding cavity (not shown) for generation of ultrasound, with a plurality of piezoelectric stacks 201 positioned over cavities (not shown) and being used deform the cavities which are overlaid by the piezoelectric stacks 202. The piezoelectric stacks 201 may each be operated similarly or identically to one another so as to identically or similarly constrict the cavities which are overlaid by the piezoelectric stacks 202 after the generation of each pulse or series of pulses of ultrasound to raise the resonance frequency of the membranes to dampen ripple—in such an embodiment, the piezoelectric stacks 202 may be similar or identical and the cavities which are overlaid by the piezoelectric stacks 202 may be similar or identical.

In this specific example, the piezoelectric stacks 202 are arranged into a four-by-four matrix, while each piezoelectric stack 201 is adjacent to a different side of the four-by-four matrix and centrally located along the perimeter of that side.

Alternatively, the piezoelectric stacks 201 may be operated differently from one another to address membranes having different inherent resonance frequencies. In this instance, the piezoelectric stacks 201 may be operated so as to tune different membranes to have a common selected resonance frequency during generation of each pulse or series of pulses of ultrasound and/or during damping of ripple thereafter.

The piezoelectric stacks 201 are depicted as being larger in diameter or area than the piezoelectric stacks 202. This may or may not be the case in any given implementation, depending upon design desired and constraints.

The piezoelectric stacks 201 may each be operated similarly or identically to one another so as to identically or similarly constrict the cavities which are overlaid by the piezoelectric stacks 202 after the generation of each pulse or series of pulses of ultrasound to raise the resonance frequency of the membranes to dampen ripple—in such an embodiment, the piezoelectric stacks 202 may be similar or identical and the cavities which are overlaid by the piezoelectric stacks 202 may be similar or identical.

Alternatively, the piezoelectric stacks 201 may be operated differently from one another to address membranes having different inherent resonance frequencies. In this instance, the piezoelectric stacks 201 may be operated so as to tune different membranes to have a common selected resonance frequency during generation of each pulse or series of pulses of ultrasound and/or during damping of ripple thereafter.

The piezoelectric stacks 201 are depicted as being larger in diameter or area than the piezoelectric stacks 202. This may or may not be the case in any given implementation, depending upon design desired and constraints.

Figures 6, 7:
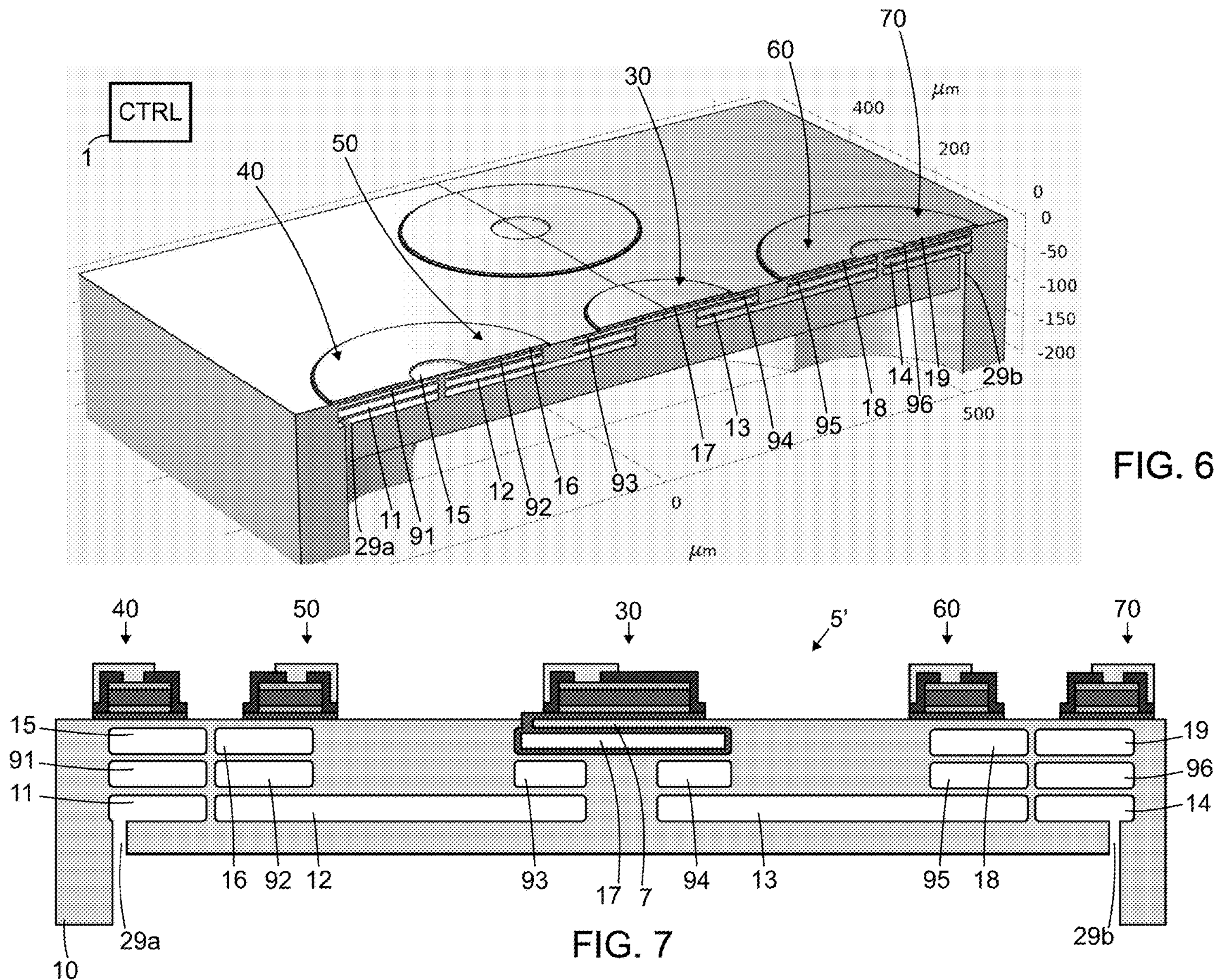
FIG. 6 is a perspective cutaway view of another embodiment of an array of PMUT devices as disclosed herein.
FIG. 7 is a cross sectional view of the array of FIG. 6.

The potential cross-sectional configurations of the array 200 may be understood from a study of the cross sections in FIGS. 2, 7, and 9 described above and need no detailed description herein.

Figures 11, 12:
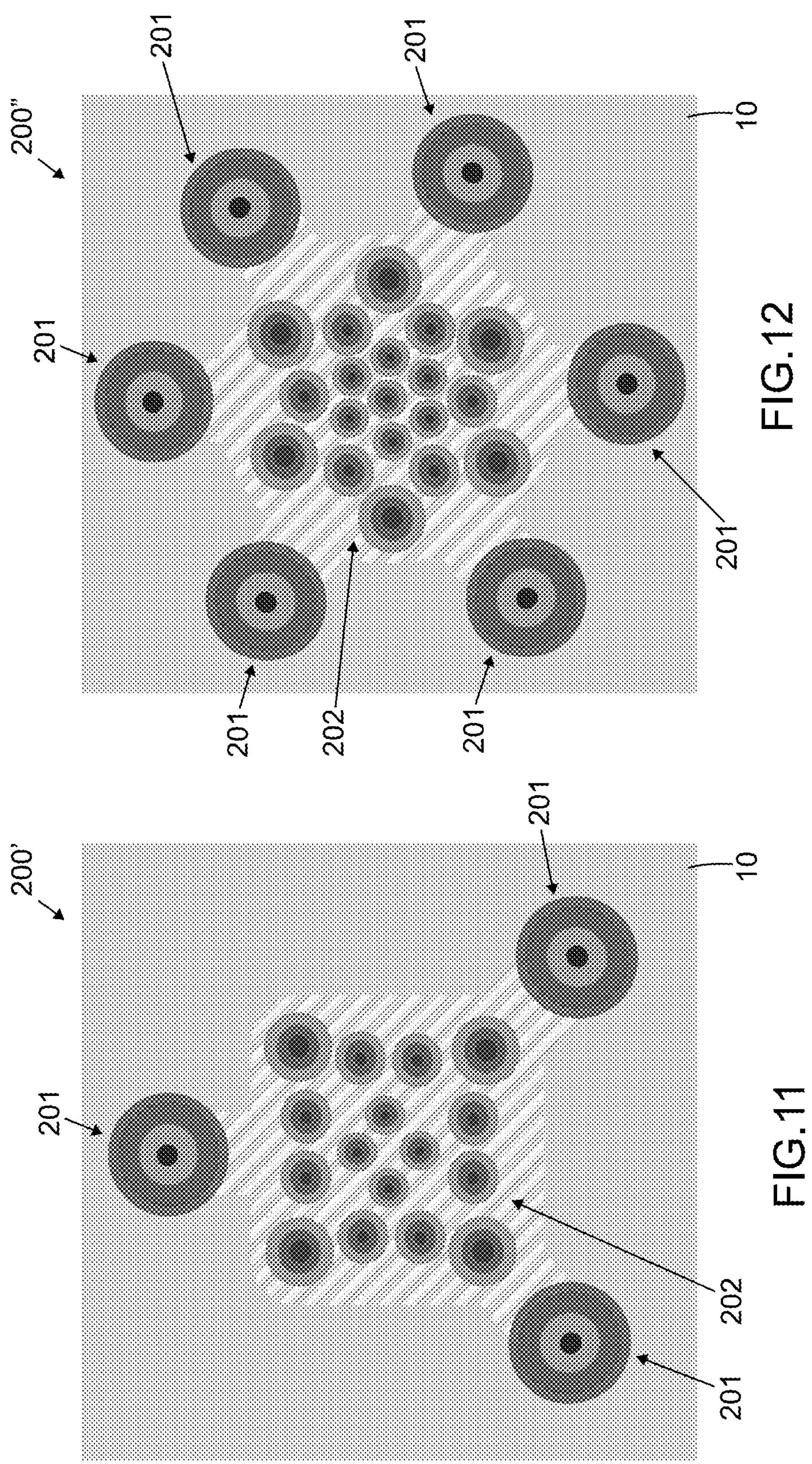
FIG. 11 is a top view of yet another embodiment of the array of PMUT devices disclosed herein.
FIG. 12 is a top view of still yet another embodiment of the array of PMUT devices disclosed herein.

A top view of another embodiment of an array 200' is now described with reference to FIG. 11.

In this embodiment, the piezoelectric stacks 202 used to generate ultrasound waves are arranged such that a box is defined by four piezoelectric stacks 202 at the corners of the box, with two piezoelectric stacks 202 on each side extending in a line from one corner of that side to the other corner of that side. The piezoelectric stacks 202 forming the sides are positioned slightly more toward the interior of the box than the piezoelectric stacks 202 forming the corners of the box. An inner diamond arrangement of four piezoelectric stacks 202 is inside the box, with each piezoelectric stack 202 of the diamond being located in a position equidistant from each piezoelectric stack 202 of the side closest to that piezoelectric stack 202 of the diamond. Two of the piezoelectric stacks 201 used for tuning membrane resonance frequency are disposed adjacent the corners of the box on a same side of the box and one of the piezoelectric stacks 201 is disposed adjacent the opposite side of the box—stated differently, the piezoelectric stacks 201 are arranged into a Y-configuration.

The piezoelectric stacks 201 may each be operated similarly or identically to one another so as to identically or similarly constrict the cavities which are overlaid by the piezoelectric stacks 202 after the generation of each pulse or series of pulses of ultrasound to raise the resonance frequency of the membranes to dampen ripple, as described above. Alternatively, as also described above, the piezoelectric stacks 201 may be operated differently from one another to address membranes having different inherent resonance frequencies.

The piezoelectric stacks 201 are depicted as being larger in diameter or area than the piezoelectric stacks 202, the piezoelectric stacks 202 forming the corners of the box are larger in diameter or area than the piezoelectric stacks 202 forming the sides of the box, and the piezoelectric stacks 202 forming the sides of the box are larger in diameter or area than the piezoelectric stacks 202 forming the diamond. This may or may not be the case in any given implementation, depending upon design desired and constraints.

A top view of another embodiment of an array 200" is now described with reference to FIG. 12. In this embodiment, the piezoelectric stacks 201 are arranged in an asterisk-shaped configuration, with piezoelectric stacks 202 being located in the center of the asterisk. The piezoelectric stacks 202 within the asterisk are arranged into a hexagonal shape containing two equilateral triangles superimposed with respect to one another but rotated 90 degrees with respect to one another, with one piezoelectric stack 202 being at the center of the asterisk (and that piezoelectric stack 202 being inside both equilateral triangles).

The piezoelectric stacks 201 may each be operated similarly or identically to one another. Alternatively, as also described above, the piezoelectric stacks 201 may be operated differently from one another.

The piezoelectric stacks 201 are depicted as being larger in diameter or area than the piezoelectric stacks 202, the piezoelectric stacks 202 forming the corners of the hexagonal shape are depicted as being larger than the piezoelectric stacks 202 forming the corners of the equilateral triangles, the piezoelectric stacks 202 forming the corners of the equilateral triangles are depicted as being larger than the piezoelectric stacks 202 forming the sides of the equilateral triangles, and the central piezoelectric stack 202 is depicted as being the same size as the piezoelectric stack 202 forming the sides of the equilateral triangles.

Figure 13:
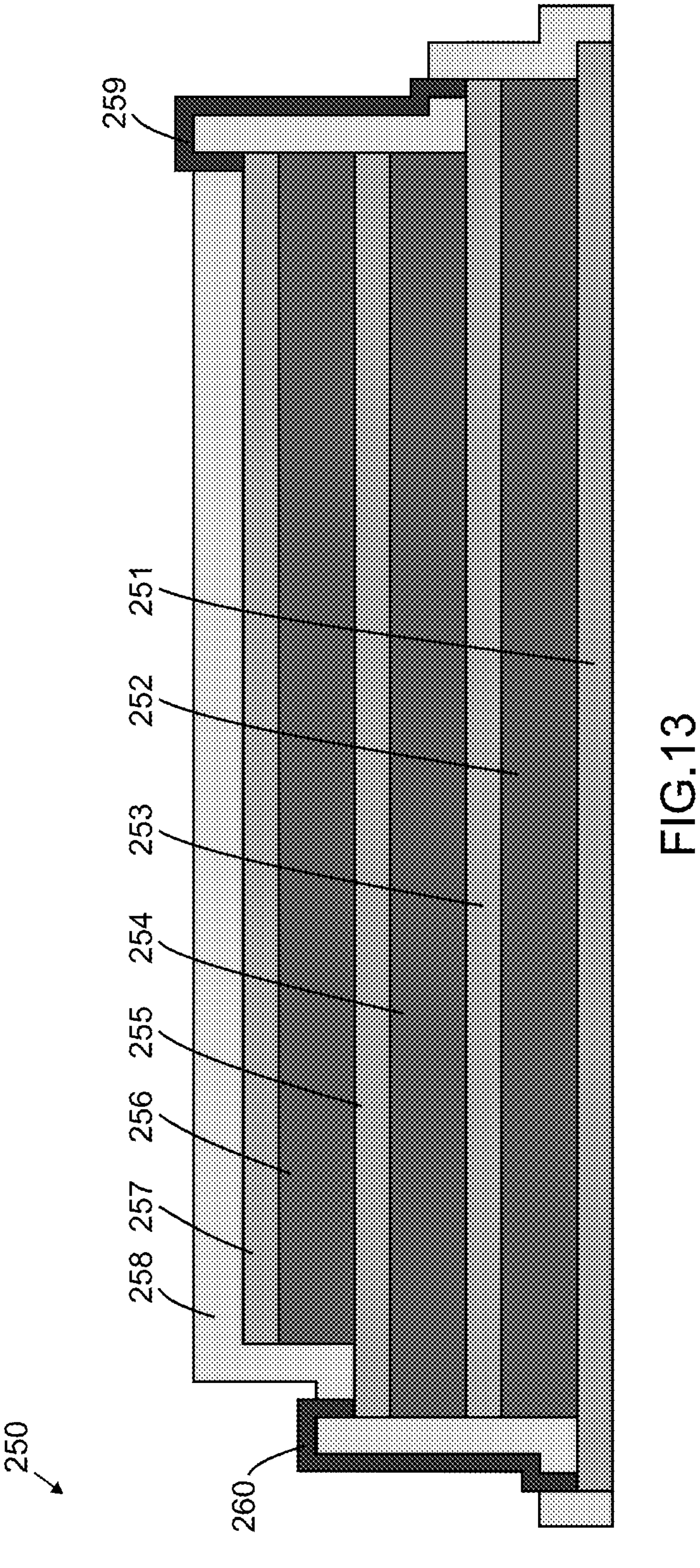
FIG. 13 is a cross sectional view of another embodiment of PMUT device such as may be used with any of the arrays disclosed herein.

The various piezoelectric stacks described above were described as including a piezoelectric layer sandwiched between top and bottom electrodes. However, the piezoelectric stacks may instead include multiple piezoelectric layers. Refer now to FIG. 13, showing an alternative piezoelectric stack 250 design such as may be used in the arrays described above. The piezoelectric stack 250 includes a first piezoelectric layer 252 sandwiched between electrodes 251 and 253, a second piezoelectric layer 254 sandwiched between electrodes 253 and 255, and a third piezoelectric layer 256 sandwiched between electrodes 255 and 257. Notice that the electrode 251 extends past the side ends of the first piezoelectric layer 252, that the electrode 253 extends past one side end of the second piezoelectric layer 254, and that the electrode 255 extends past one side end of the third piezoelectric layer 256.

A dielectric layer 258 covers the top face of the electrode 257 as well as portions of the top faces of electrode 255, 253, and 251. The dielectric layer 258 covers the side ends of electrodes 257, 255, 253, and 251, as well as the side ends of the piezoelectric layers 256, 254, and 252. An interconnection 260 is in electrical and physical contact with the top face of electrodes 255 and 251, and an interconnection 259 is in electrical and physical contact with the top face of electrodes 257 and 253. It follows from this that electrodes 251 and 255 are actuated in parallel and electrodes 257 and 253 are actuated in parallel.

This design of piezoelectric stack 50 may serve to provide for additional levels of deformation to either a substrate or a membrane.

Figures 14A, 14B, 14C:
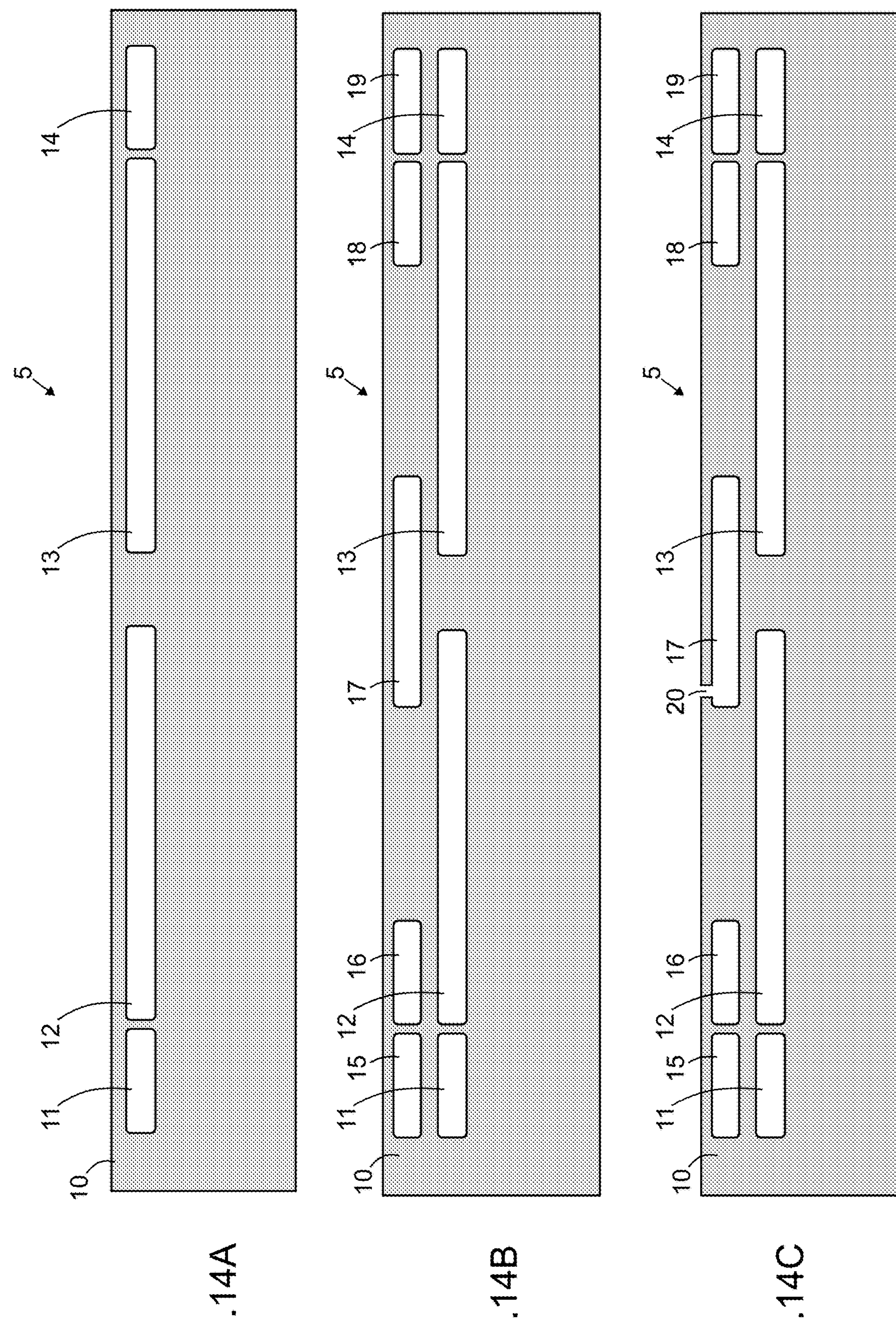
FIGS. 14A-14J are a series of cross-sectional views showing the process flow for forming the array of FIGS. 1-2.
Figures 14D, 14E:
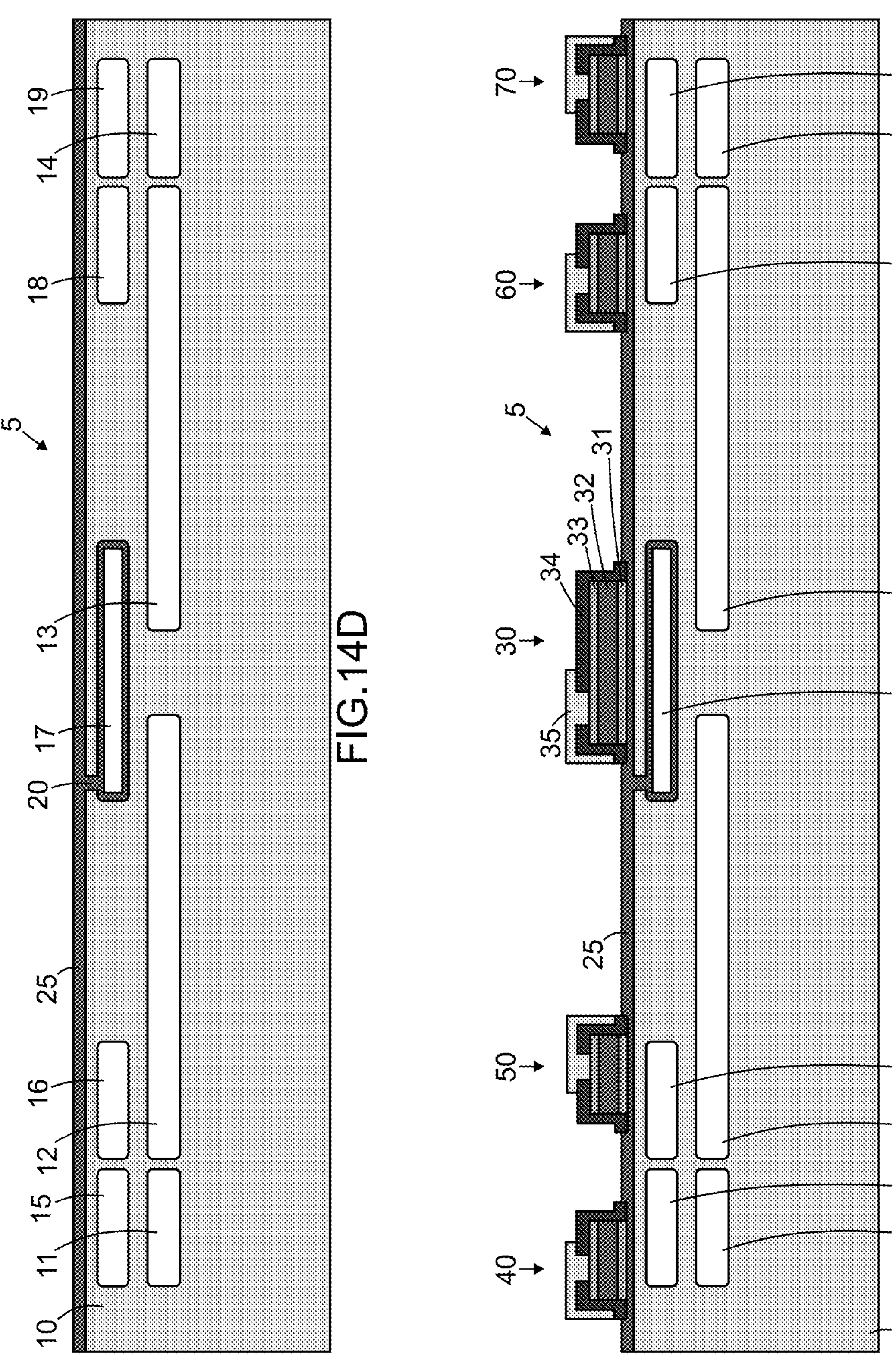
Figures 14F, 14G:
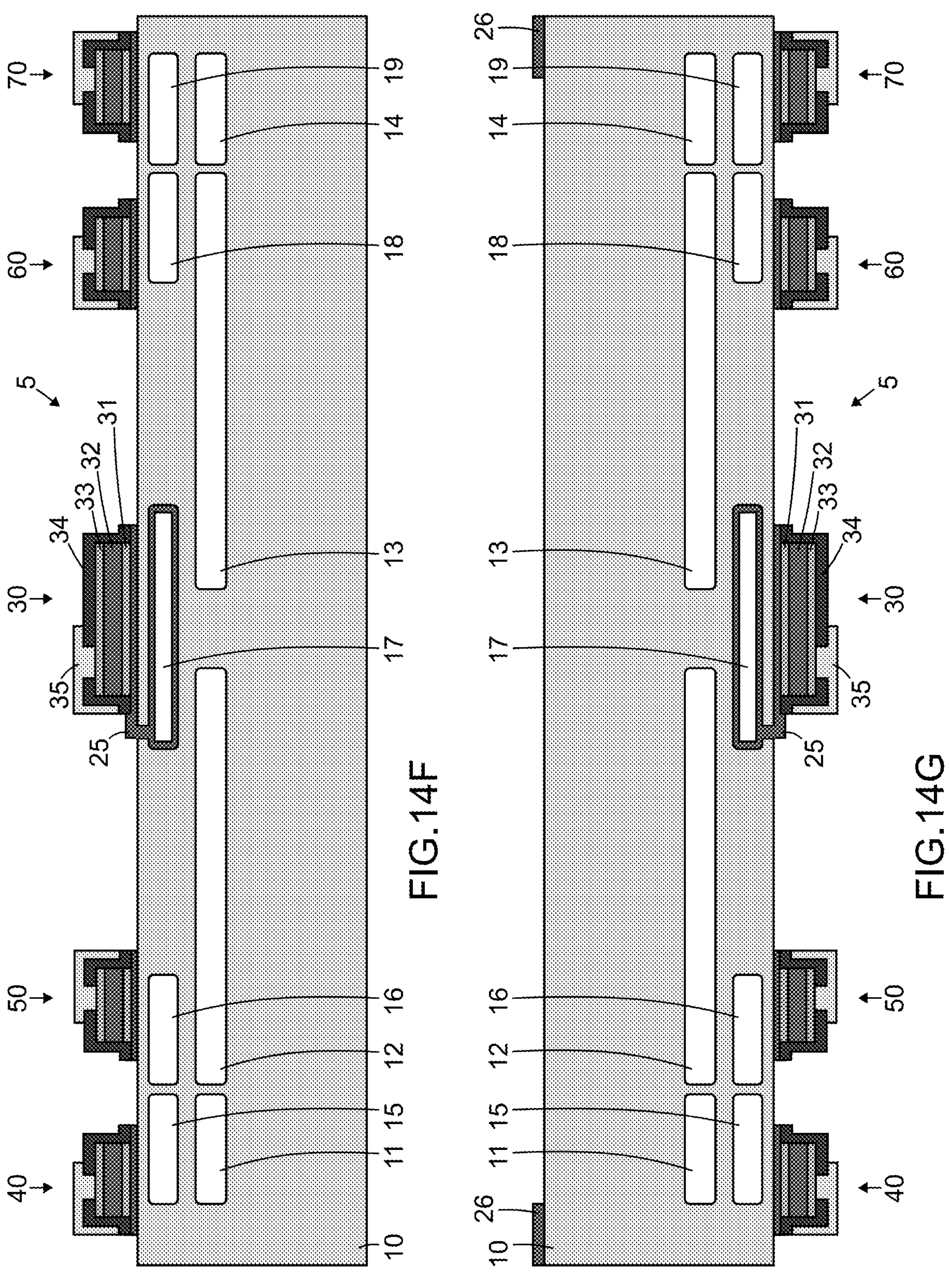
Figures 14H, 14I:
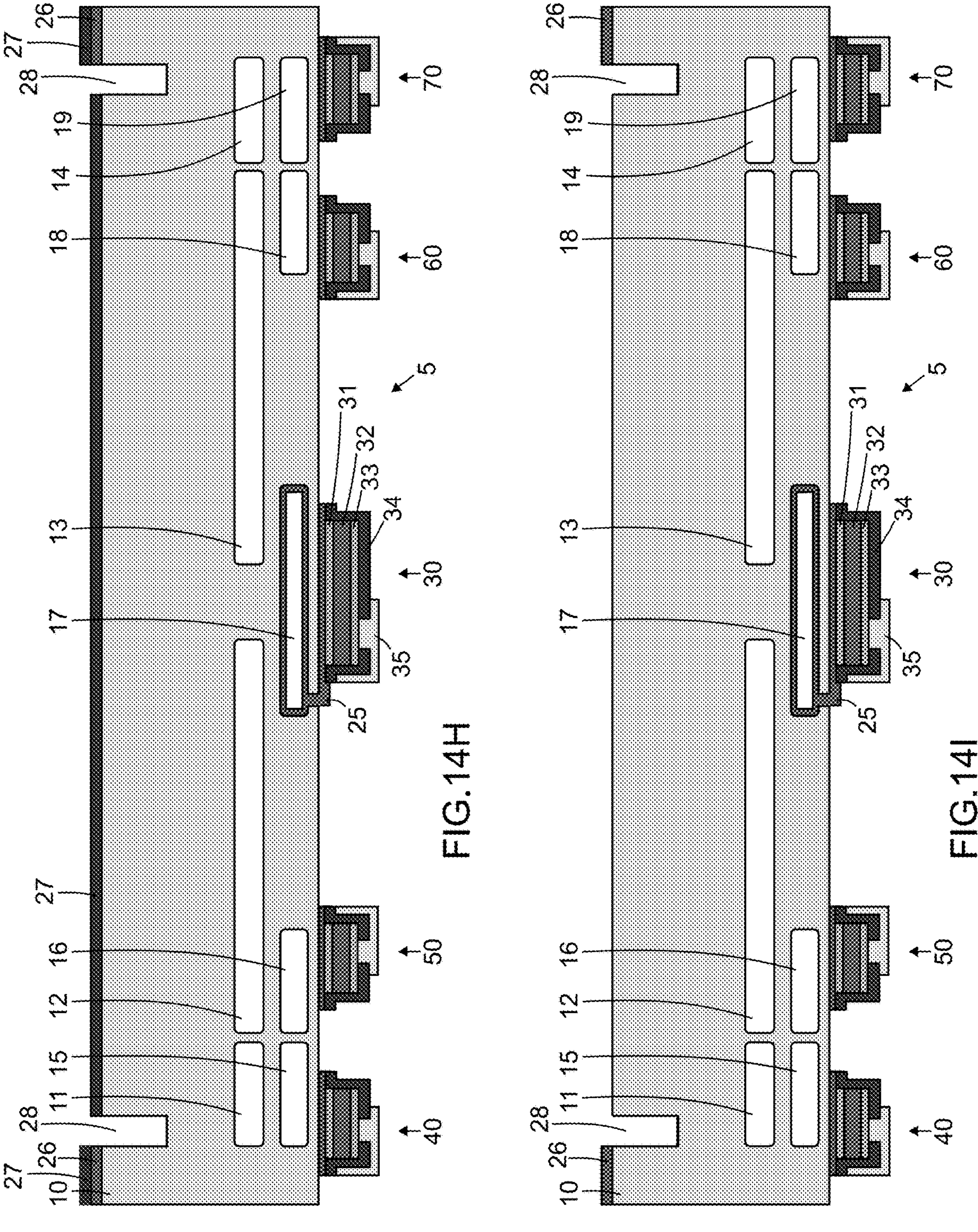
Figure 14J:
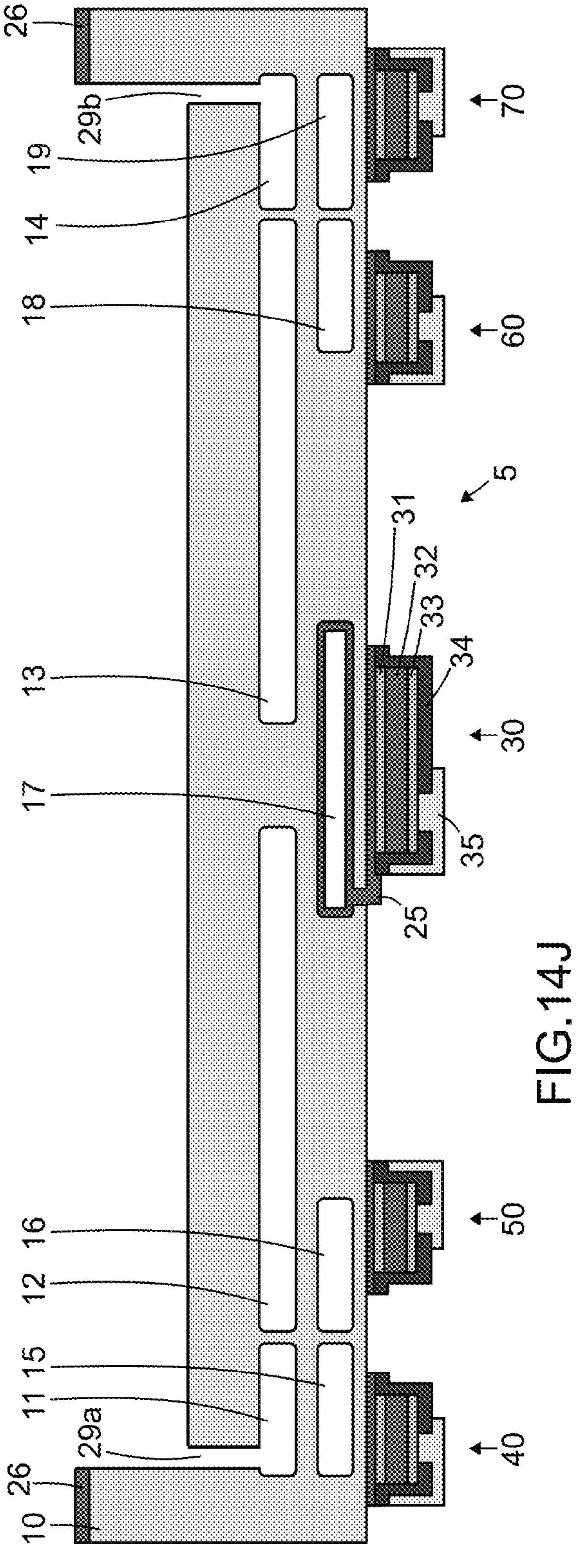

A sample process flow for the formation of the array 5 described above is now provided with additional reference to FIGS. 14A-14J. Initially, a monocrystalline silicon substrate 10 is formed to have cavities 11, 12, 13, and 14 buried therein, as shown in FIG. 14A, and then building up of the thickness of the substrate 10 to include chambers 15, 16, 17, 18, and 19, as shown in FIG. 14B. Then, a small hole 23 is formed in the substrate 10 over the cavity 17, thereby connecting the interior of the cavity to the external environment, as shown in FIG. 14C. This is followed be deposition of a tetraethyl orthosilicate (TEOS) layer 25 over the top face of the substrate 10, as shown in FIG. 14D. This step results in the TEOS layer 25 plugging the hole 20 in the substrate 10 over the chamber 17. Subsequent to this, the piezoelectric stacks 30, 40, 50, 60, and 70 are formed, as shown in FIG. 14E. The exposed portions of the TEOS layer 25 are then removed, as shown in FIG. 14F. The substrate 10 is then flipped and an oxide layer 26 is deposited and patterned, as shown FIG. 14G. A resist layer 27 is then deposited over the oxide layer 26, patterned, and an etch is performed to form trenches 28, as shown in FIG. 14H. The resist 27 is then removed as shown in FIG. 14I and an etch is performed to thin the back face of the substrate 10 and form trenches 29*a* and 29*b*, as shown in FIG. 14J. The substrate 10 is then flipped back over to complete the formation of the array 5 of FIG. 2.

The arrays described hereinabove are usable in a variety of applications, including eye position tracking in which the arrays are used to emit ultrasonic waves toward the eye and reflections of the ultrasonic waves off the eye are detected, the distance to parts of the eye can be measured, the time of flight of those ultrasonic waves is measured to determine the distance to the parts of the eye, and the position of the eye is tracked by comparing the distances to the different parts of the eye over time.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An array of piezoelectric micromachined ultrasound transducers (PMUTs) comprising:

a substrate having at least one first cavity and at least one second cavity buried therein;

at least one first piezoelectric stack carried by the substrate and at least partially overlaying the at least one first cavity;

at least one second piezoelectric stack carried by the substrate and at least partially overlaying the at least one second cavity;

wherein a thickness of the substrate between the at least one second cavity and the at least one second piezoelectric stack forms a membrane; and circuitry configured to operate the at least one second piezoelectric stack so as to vibrate the membrane to generate a pulse of ultrasound and to immediately subsequently operate the at least one first piezoelectric stack to cause deformation of the at least one second cavity which results in an increase in a resonant frequency of the membrane.

2. The array of claim 1, wherein the at least one second cavity is sized and shaped so that the membrane is larger in area than the at least one second piezoelectric stack such that the at least one second piezoelectric stack is carried in its entirety by the membrane.

3. The array of claim 1, wherein the at least one first cavity comprises a pair of adjacent cavities buried within the substrate; wherein the at least one first piezoelectric stack comprises a pair of first piezoelectric stacks each carried by the substrate and at least partially overlying an associated one of the pair of adjacent cavities; and wherein the pair of first piezoelectric stacks are differentially driven by the circuitry during operation when causing deformation of the at least one second cavity to result in the increase in the resonant frequency of the membrane.

4. The array of claim 1, wherein the at least one second cavity comprises a plurality of adjacent second cavities; wherein the at least one second piezoelectric stack comprises a plurality of second piezoelectric stacks each carried by the substrate and at least partially overlying an associated one of the pair of adjacent second cavities; wherein a thickness of the substrate between each of the plurality of adjacent second cavities and an associated one of the plurality of second piezoelectric stacks forms a different membrane.

5. The array of claim 4, wherein each of the plurality of second piezoelectric stacks is operated simultaneously by the circuitry to vibrate an associated membrane one of the different membranes to generate a pulse of ultrasound and immediately subsequently each of the plurality of first piezoelectric stacks is operated simultaneously by the circuitry to cause an increase in a resonant frequency of the different membranes.

6. The array of claim 5, wherein the increases in the resonant frequency of the different membranes are equal.

7. The array of claim 1, wherein the substrate has at least one third cavity buried therein directly underlying the at least one first cavity; and wherein the substrate has at least one fourth cavity buried therein directly underlying the at least one second cavity.

8. The array of claim 1, wherein the at least one first cavity comprises plurality of first cavities buried within the substrate and arranged into a first desired shape about perimeter of a given location; wherein the at least one first piezoelectric stack comprises a plurality of first piezoelectric stacks each carried by the substrate and at least partially overlying an associated one of the plurality of first cavities; wherein the at least one second cavity comprises a plurality of second cavities buried within the substrate and arranged into a second desired shape inside the perimeter of the given location; wherein the at least one second piezoelectric stack comprises a plurality of second piezoelectric stacks each carried by the substrate and at least partially overlying an associated one of the plurality of second cavities; and wherein a thickness of the substrate between each of the plurality of second cavities and an associated one of the plurality of second piezoelectric stacks forms a different membrane.

9. The array of claim 8, wherein the first desired shape is a first rectangular shape; wherein the second desired shape is a second rectangular shape.

10. The array of claim 9, wherein first and second desired shapes are rotated with respect to one another about a central point.

11. The array of claim 9, wherein the plurality of second cavities are greater in number than the plurality of first cavities; wherein the plurality of second piezoelectric stacks are greater in number than the plurality of first piezoelectric stacks.

12. The array of claim 8, wherein the piezoelectric stacks of the plurality of first piezoelectric stacks are larger in area than the piezoelectric stacks of the second plurality of second piezoelectric stacks.

13. The array of claim 1, wherein the deformation of the at least one second cavity which results in an increase in the resonant frequency of the membrane is a reduction in a depth of the at least one second cavity.

14. A method of generating ultrasound, the method comprising:

a) operating at least one second piezoelectric stack so as to vibrate an underlying membrane forming a roof of a subsurface cavity to thereby generate at least one pulse of ultrasound;

b) immediately subsequently to performing a), operating at least one first piezoelectric stack so as to deform a substrate into which the subsurface cavity is buried to cause deformation of the subsurface cavity, thereby increasing a resonant frequency of the membrane; and returning to a).

15. The method of claim 14, wherein the operating of the at least one second piezoelectric stack comprises operating a plurality of second piezoelectric stacks to vibrate respective different underlying membranes forming roofs of respective subsurface cavities associated with the plurality of second piezoelectric stacks to thereby generate at least one pulse of ultrasound.

16. The method of claim 15, wherein the operating of the at least one first piezoelectric stack comprises operating a plurality of first piezoelectric stacks to cause an increase in the resonant frequency of the different membranes.

17. The method of claim 16, wherein the increases in the resonant frequency of the different membranes are equal.

18. The method of claim 14, wherein the deformation of the subsurface cavity which results in an increase in the resonant frequency of the membrane is a reduction in a depth of the subsurface cavity.

* * * * *